United States Patent [19]

Codrington et al.

[11] Patent Number: 5,038,105
[45] Date of Patent: Aug. 6, 1991

[54] SERIES/PARALLEL DOUBLE-TUNED NMR COILS

[75] Inventors: Robert S. Codrington, Los Altos Hills; Alan R. Rath, Fremont, both of Calif.

[73] Assignee: Spectroscopy Imaging Systems Corporation, Fremont, Calif.

[21] Appl. No.: 477,687

[22] Filed: Feb. 9, 1990

[51] Int. Cl.$^5$ ............................................. G01R 33/20
[52] U.S. Cl. ................................................. 324/318
[58] Field of Search ............... 324/318, 322; 307/520, 307/522; 328/137, 138; 455/325, 327; 333/126, 129, 132, 134

[56] References Cited

U.S. PATENT DOCUMENTS

| | | | |
|---|---|---|---|
| 4,792,759 | 12/1988 | Keren et al. | 324/322 |
| 4,801,885 | 1/1989 | Meissner et al. | 324/322 |
| 4,812,764 | 3/1989 | Bendall | 324/322 |
| 4,885,541 | 12/1989 | Hayes | 324/322 |
| 4,916,418 | 4/1990 | Rath | 324/318 |
| 4,928,064 | 5/1990 | Keren | 324/322 |

Primary Examiner—Michael J. Tokar
Attorney, Agent, or Firm—Stanley Z. Cole; Gerald M. Fisher; Edward H. Berkowitz

[57] ABSTRACT

A double-tuned circuit is realized from $\frac{1}{2}\lambda_1$ transmission lines for connecting a pair of inductors in series at a first frequency and in parallel for a second frequency where said first and second frequencies are in the ratio of a power of two.

6 Claims, 3 Drawing Sheets

SERIES/PARALLEL DOUBLE-TUNED NMR COILS

FIELD OF THE INVENTION

The invention is in the area of NMR probe circuits particularly such probe circuits exhibiting double-tuned response.

BACKGROUND OF THE INVENTION

In the area of nuclear magnetic resonance, the need for apparatus concurrently sensitive to non-adjacent spectral regions is encountered in several contexts. One common example occurs where a sample is irradiated at some (high) frequency for one purpose while the same sample is concurrently irradiated at another (low) frequency for some other purpose. This is typical of a decoupling experiment wherein, for example, carbon 13-hydrogen chemical bonds are decoupled while separately exciting the carbon 13 resonance concurrently.

One variation of such a double-tuned arrangement is the need for concurrent excitation and observation of chemically distinct samples where one such sample is a control employed for instrumental purposes such as the establishment of a field frequency lock, while the second sample is under study. One example of this arrangement is to be found in U.S. Pat. No. 3,434,043, commonly assigned. Another similar circumstance is the desire to concurrently excite selected different nuclei for acquisition of corresponding spectral response.

A double-tuned circuit ordinarily utilizes a single inductor common to two resonant circuits. Each sub-circuit in such an arrangement is separately tuned and impedance matched to its respective rf source (or sink). In one class of double-tuned arrangement it is necessary for an isolation element to be inserted between high frequency and low frequency sources. This permits concurrent excitation from respective rf sources. Double-tuned circuits are known which employ a transmission line of length $\lambda/4$ (at the high frequency) to provide such isolation. For an example of such an arrangement see Stoll, Vega, and Vaughan, Rev. Sci. Inst., v. 48, pp. 800–803 (1977). Balanced circuits exhibiting electrical symmetry are also known for the purpose of supporting double-tuned apparatus. Such circuits, exhibit among other properties, the virtue that a symmetry plane (or other surface) is defined which has a property of electrical neutrality, which is to say, a virtual ground.

Inductive elements in rf probe circuits are known to include "split inductors" such as taught in the work of Alderman and Grant, J. Mag. Res., v. 36, pp. 447–451 (1979).

An example of a balanced double-tuned circuit with split inductors and capacitances for NMR observe coils is to be found in U.S. Pat. No. 4,833,412. A double-tuned balanced circuit using lumped elements for a birdcage geometry is described in U.S. Pat. No. 4,916,418.

A saddle coil for multiple tuned response is realized by providing a segmented sequence of reactances wherein each such reactance includes alternate rf current paths exhibiting widely distinct impedance characteristic of the respective resonant frequencies. This work is described in U.S. Ser. No. 07/603,966, commonly assigned.

The present invention is motivated by a desire to observe $C^{13}$ NMR signals at about 50 MHz while concurrently irradiating the sample with decoupling radiation at about 200 MHz.

The resonant frequencies in hydrogen and $C^{13}$ are almost exactly in the ratio of 4 to 1. The ratio of the LC (inductance capacitance) product for a simple tuned circuit resonant at the high frequency carbon resonance to the LC product for a similar circuit resonant at the low frequency (e.g. same magnetic field) is about 16. In one common approach to double-tuned circuits, the inductance L is common to both resonant sub-circuits forming the double-tuned resonant circuit. Thus, the capacitance ratio in such respective sub-circuits will also be 16.

In the present invention the double-tuned character of the circuit is realized with two inductors (which could comprise saddle coils or surface coils) which are in parallel for the high frequency sub-circuit, but which form a series combination for the low frequency sub-circuit. The effective inductance ratio in this case is thus 4:1 (200 MHz:50 MHz), reducing the required capacitance ratio from 16:1 to 4:1.

DETAILED DESCRIPTION OF THE INVENTION

Figure 1:
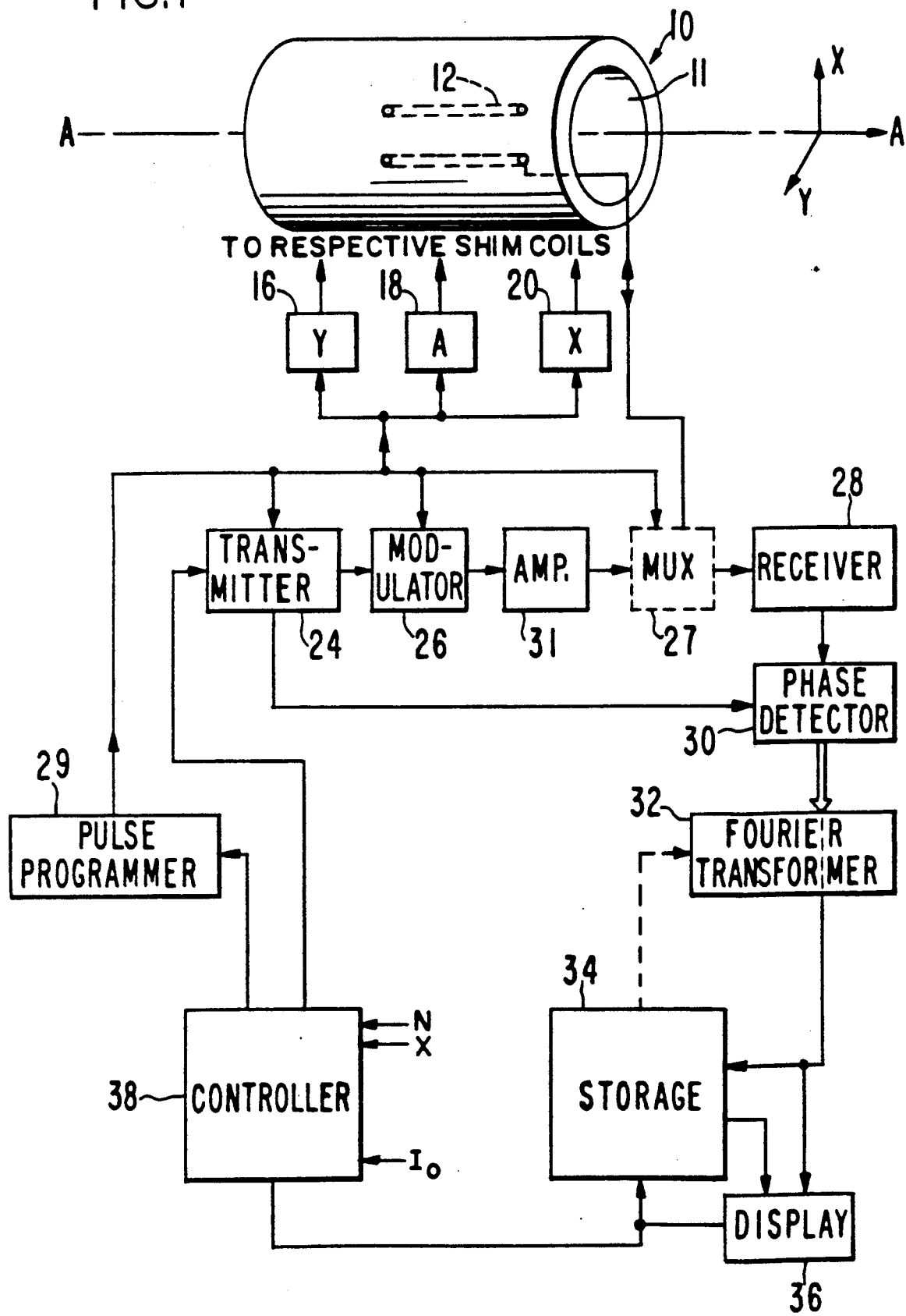
FIG. 1 shows the general context of a system embodying this invention.

Portions of a typical NMR data acquisition instrument are schematically illustrated on FIG. 1. An acquisition/control processor 110 communicates with an rf transmitter 112, modulator 114 and receiver 116, including analog-to-digital converter 118 and a further processor 120. The modulated rf power irradiates an object (not shown) in a magnetic field 121 through a probe assembly 122 and the response of the object is intercepted by probe 122 communicating with receiver 116. The response typically takes the form of a transient oscillatory signal, or free induction decay. This transient waveform is sampled at regular intervals and samples are digitized in ADC 118. The digitized time domain waveform is then subject to further processing in processor 120. The nature of such processing may include averaging a time domain waveform with a number of nominally identical such waveforms, and transformation of the average time domain waveform to the frequency domain yields a spectral distribution function directed to output device 124. The latter may take on any of a number of identities for the display of further analysis and data.

The magnetic field 121 which polarizes a sample is established by an appropriate means indicated in FIG. 1 as maintained in cryostat 123 for the establishment and maintenance of a superconducting phase in a solenoid, not shown. The cryostat comprises a bore 123A in which the probe and sample are housed at room temperature.

Figure 2:
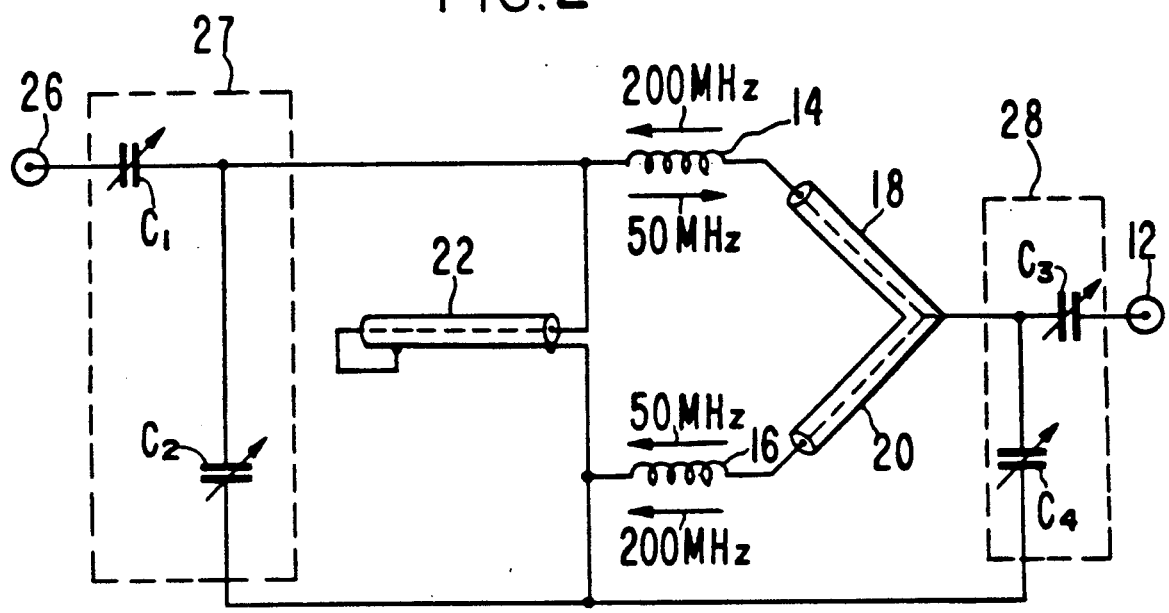
FIG. 2 is one example of a double-tuned circuit of the present inventions.

Turning now to FIG. 2 there is shown an example of a double-tuned arrangement following the present invention, which is concurrently resonant at 50 and 200

MHz. Rf excitation at 200 MHz is applied at 12 to inductors 14 and 16 in parallel through identical transmission lines 18 and 20, each of length one wavelength (at 200 MHz; λ/4 at 50 MHz). The other ends of coils 14 and 16 are connected through transmission line 22 also of unit wavelength at 200 MHz which is effectively a short to ground.

The 50 MHz excitation is applied at 26. Transmission line 22 appears to the 50 MHz source as a shorted λ/4 transmission line and thereby presents a high impedance. The transmission lines 18 and 20 in series with the 50 MHz source comprise a λ/2 transmission line (at 50 MHz). Consequently the 50 MHz excitation is directed in series through coils 14 and 16.

Figure 3A:
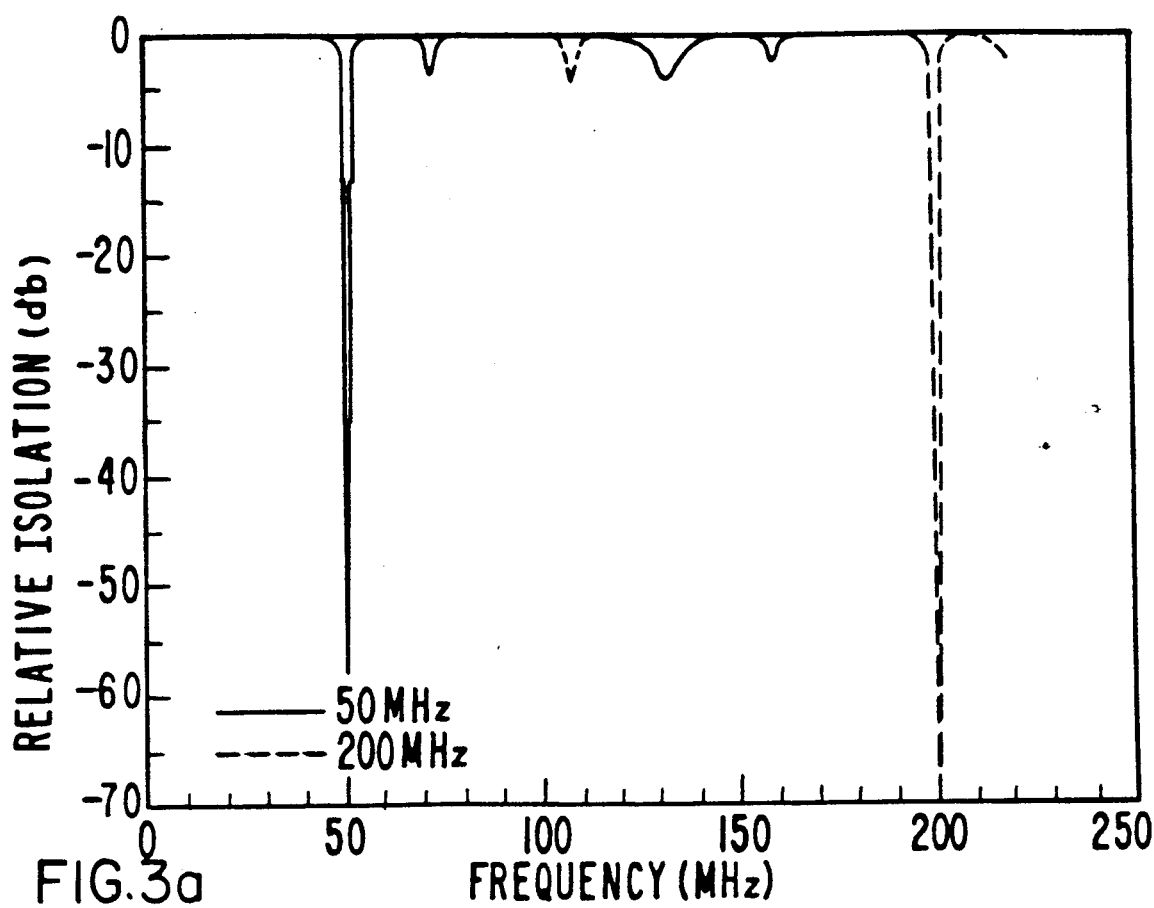
FIG. 3a and 3b show the frequency response for the double-tuned circuit in FIG. 2.
Figure 3B:
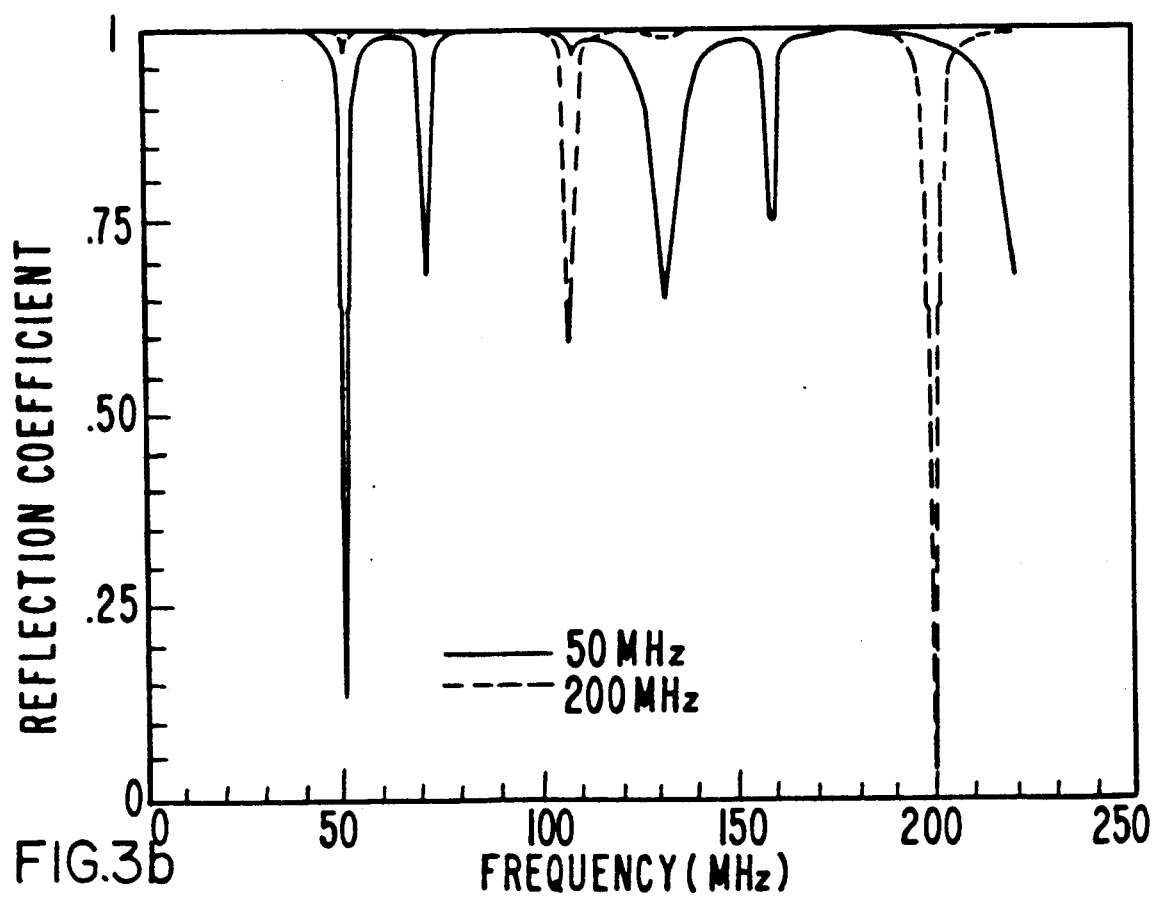

Capacitive combinations 27 and 28 provide impedance matching and tuning for the respective 50 MHz and 200 MHz sub-circuits. FIGS. 3a and 3b show the computed response of a representative system. The circuit of FIG. 2 was studied for the case where the inductances 14 and 16 are each 200 NH with a Q of 100 at 200 MHz. The three transmission lines are each one wavelength at 200 MHz exhibiting an attenuation of 20 db/$10^2$ meter at 200 MHz. The tuning and matching networks are characterized by $C_1=10.9$ pf; $C_2=13.62$ pf; $C_3=3.73$ pf; and $C_7=2.64$ pf.

In FIG. 3b there is shown the reflection coefficient corresponding to rf power at 200 MHz and 50 MHz applied at the respective inputs 12 and 26. In FIG. 3a there is shown the relative isolation in db for the same circuit. Resonant behavior at other frequencies corresponds to the non-idealities of any realization of the circuit including couplings and effects of secondary current paths.

Figure 4A:
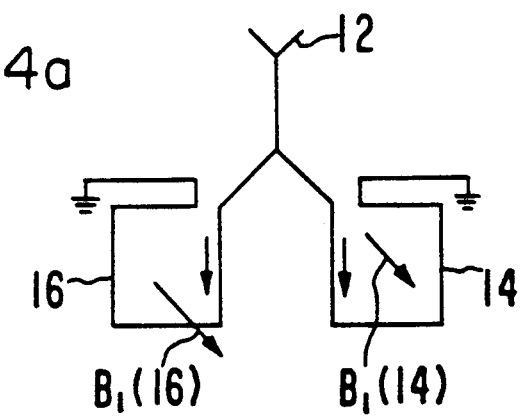
FIGS. 4a and 4b are, respectively, the isolation and reflection coefficient behavior of a circuit following FIG. 2.
Figure 4B:
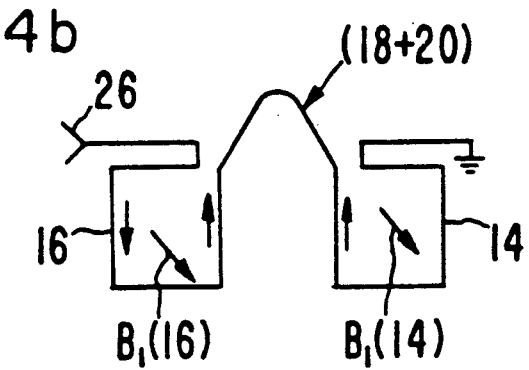

It is important to recognize that the series combination at the lower frequency occurs through an additional ½ λ (lower frequency) rf path. Consequently there is a 180° phase increment in the series combination of the two inductors. The significance of this observation is best explained in reference to FIG. 4. Inductors 14 and 16 (of FIG. 2) are of some selected helicity and relative geometry. Assume that the instantaneous magnetic field $B_1$ is as shown for the high frequency case of FIG. 4a. The low frequency energy is driven from point 26 and for this situation the low frequency rf path includes a ½ λ line (18+20). Accordingly, the resulting instantaneous magnetic field vectors $B_1$ for the respective inductors 14 and 16 remain in the same relative relationships for both high and low frequency resonances.

Efficiency of the above described arrangement is the ratio of rf power dissipated in the inductors 14 and 16 to the rf power applied at the ports 12 and 26 for each respective frequency. For the above described example, the efficiency is largely affected by losses in the transmission lines. Considering such losses for two different types of transmission lines, one finds:

|  | Efficiency @ | |
| --- | --- | --- |
|  | 50 MHz | 200 MHz |
| 20 db/$10^2$ m @ 200 MHz | 52.6% | 27.6% |
| 6 db/$10^2$ m @ 200 MHz | 72.4% | 46.4% |

No attempt has been made to maximize the efficiency or sensitivity of the example here described, which is based on commercially available coaxial cable. The efficiency of the circuit can be improved, particularly at the lower frequency, by using special transmission lines such as strip lines or rigid coaxial cables. It should be noted that traditional methods of deriving the signal-to-noise ratio of N.M.R. detection circuits based on proportionality to the square root of the Q or quality factor can be misleading when applied to these transmission line circuits which can show a higher Q than non-transmission line circuits but show a lower signal-to-noise ratio. A discussion of the losses and efficiencies of this class of circuits related to the present invention, which incorporate transmission line elements, may be found in co-pending U.S. Ser. No. 287,789, commonly assigned, and incorporated by reference herein.

The above discussion was primarily motivated by the desire to facilitate NMR experiments where resonances of $C^{13}$ and protons might be concurrently studied. The respective gyromagnetic ratios are in the ratio of 3.977. Frequencies in the exact relationship of a power of 2 are often encountered, by accident or design, as harmonics of the identical fundamental frequency. The present invention is capable of responding to harmonics of order N and $N+2^k$. Consequently, apparatus for the generation or monitoring of such frequencies can advantageously employ the principles herein.

For example, the above described arrangement may be adapted for operation with a pair of frequencies in the ratio of 2:1 if (high frequency) tuned transmission lines 20 and 18 are cut for $\lambda_{hi}/4$ and the transmission line 22 is cut for $\lambda_{hi}/2$. The generalization of the circuit to frequency pairs in the ratio $2^k$, $k \geq 1$ is evident, e.g. for $(f_{hi}/f_{low})=2^k$, the required cable lengths for lines 22, 20 and 18 is $(\lambda_{Hi}/4)(2^k)$.

The multiple resonant behavior discussed herein in the context of excitation of rf resonances from distinct radio frequencies applied to the inputs should be understood to include similar multiple resonant response for inductive coupling to the coils of rf energy radiated from a nuclear resonant sample following excitation. Such multiple resonant behavior may be employed in either excitation of resonant condition (s), the observation of such resonance(s) or both of the foregoing.

The above invention has been described as referenced to a particular embodiment and example, however, other modifications and variations will occur to those skilled in the art in view of the above teaching. It is to be understood that this invention may be practiced otherwise than as specifically described and is limited only by the scope of the dependent claims.

What is claimed is:

1. A circuit concurrently resonant at two non-adjacent frequencies $\omega_1$ and $\omega_2$ comprising:
   (a) Inductance means comprising a pair of two terminal inductive members, a first terminal of the first inductive member connected in common through a first impedance matching capacitor network to a first rf terminal and to one terminal of a two terminal transmission line of length $\lambda_1/4$ at a first selected rf frequency $\omega_1$, said transmission line shorted at said distance of $\lambda_1/4$, the second terminal of said transmission line connected to a first terminal at said second inductive member,
   second and third transmission lines, each of length $\lambda_1/2$, and each connected at one end thereof to respective second terminals of first and second inductive members, said second and third transmission lines connected in series to form a junction, said junction connected through a second impedance matching network to a second rf terminal, whereby said circuit is concurrently resonant at said first rf frequency $\omega_1$ applied or observed at said first rf terminal and also resonant at a second rf frequency $\omega_2$ applied or observed at said second terminal, where said first and second rf frequencies are characterized by opposite phase.

2. The circuit of claim 1 wherein said frequencies $\omega_1$ and $\omega_2$ are substantially in the ratio $\omega_2/\omega_1 \approx 4$.

3. The circuit of claim 1 wherein said frequencies $\omega_1$ and $\omega_2$ are in the ratio $2^k$ k is an integer.

4. A method for accomplishing resonant response to a pair of frequencies $\omega_1$ and $\omega_2$ and corresponding wavelengths $\lambda_1$ and $\lambda_2$, $\omega_2/\omega_1 \approx 4$, said method comprising:

forming a series circuit relationship by connecting at least one transmission line of length $\lambda_1/4$ between first and second inductors, said circuit substantially resonant at frequency $\omega_1$ arranging a parallel circuit relationship of said first and second inductors through at least one additional $\frac{1}{2} \lambda_1$ transmission lines, said parallel circuit substantially resonant at frequency $\omega_2$, whereby said parallel arrangement is characterized by relatively high impedance and said series arrangement is characterized by relatively low impedance at a frequency of substantially $\omega_1$, and said parallel arrangement is characterized by relatively low impedance and said series arrangement is characterized by relatively high impedance at a frequency of substantially $\omega_2$.

5. An NMR apparatus for analyzing a sample comprising a plurality of nuclear species, said apparatus comprising:

(a) polarizing magnet means for defining an axis, (b) first rf source means for exciting first nuclear species of said sample to a resonant condition, (c) second rf source means for exciting second nuclear species of said sample to a resonant condition, (d) receiver means for establishing the frequency and phase response of said sample to either of said first and second rf source means, (e) double tuned circuit means for coupling said sample to said receiver means comprising first and second inductive members, first transmission line means for coupling said inductors in series relationship therewith and first capacitive member arranged to tune said series related first and second inductors to resonance at first frequency $\omega_1$, second transmission line means for associating said first and second inductors in parallel with one another and second capacitive means for tuning said parallel related first and second inductors to resonance at a second frequency $\omega_2$, said first transmission line means effective at $\omega_1$ and substantially ineffective for frequencies close to $\omega_2$ and said second transmission line means effective at $\omega_2$ and substantially ineffective for frequencies close to $\omega_1$.

6. An NMR apparatus for analyzing a sample comprising a plurality of nuclear species, said apparatus comprising:

(a) polarizing magnet means for defining an axis, (b) first rf source means for exciting first nuclear species of said sample to a resonant condition, (c) second rf source means for exciting second nuclear species of said sample to a resonant condition, (d) receiver means for establishing the frequency and phase response of said sample to either of said first and second rf source means, (e) double tuned circuit means for coupling said sample to said receiver means comprising first and second inductive members, first transmission line means for coupling said inductors in series relationship therewith and first capacitive member arranged to tune said series related first and second inductors to resonance at first frequency $\omega_1$, second transmission line means for associating said first and second inductors in parallel with one another and second capacitive means for tuning said parallel related first and second inductors to resonance at a second frequency $\omega_2$, said first transmission line means effective at $\omega_1$ and substantially ineffective for frequencies close to $\omega_2$ and said second transmission line means effective at $\omega_2$ and substantially ineffective for frequencies close to $\omega_1$.

* * * * *